(12) United States Patent  (10) Patent No.: US 7,902,839 B2
Sato  (45) Date of Patent: Mar. 8, 2011

(54) POWER-CONTROL DEVICE, ELECTRONIC APPARATUS INCLUDING THE SAME, AND METHOD FOR ACTIVATING ELECTRONIC APPARATUS

(75) Inventor: Kunio Sato, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 377 days.

(21) Appl. No.: 12/044,386

(22) Filed: Mar. 7, 2008

(65) Prior Publication Data

US 2008/0218183 A1    Sep. 11, 2008

(30) Foreign Application Priority Data

Mar. 9, 2007  (JP) ................. 2007-060210

(51) Int. Cl.
  *G01R 27/26* (2006.01)
(52) U.S. Cl. ............... 324/663; 324/658; 324/661
(58) Field of Classification Search ............ 324/663
  See application file for complete search history.

(56) References Cited

U.S. PATENT DOCUMENTS

| 5,594,222 | A  | * | 1/1997 | Caldwell ............... 200/600 |
| 5,856,646 | A  | * | 1/1999 | Simon .................. 200/600 |
| 6,466,036 | B1 | * | 10/2002 | Philipp ................. 324/678 |
| 6,897,390 | B2 | * | 5/2005 | Caldwell et al. ......... 200/512 |
| 6,960,790 | B2 | * | 11/2005 | Miyai et al. ............ 257/77 |
| 2004/0201772 | A1 | | 10/2004 | Kobayashi |
| 2009/0127003 | A1 | * | 5/2009 | Geaghan ............... 178/18.03 |

* cited by examiner

*Primary Examiner* — Thomas Valone
(74) *Attorney, Agent, or Firm* — Brinks Hofer Gilson & Lione

(57) ABSTRACT

A sensor unit is configured to have an insulating case covering a mobile phone, a conductive substrate provided on the inner surface of the case, and a sensor electrode fixed on the surface of the conductive substrate. When a part of the human body of a user, such as a finger or a hand of the user, touches the surface of the case, a detection unit detects a change in capacitance provided between the human body and the conductive substrate. When it is determined that the user has touched the mobile phone, an activation signal is output and the operation mode of the mobile phone is set to a normal power mode in which power is automatically supplied. With this configuration, the operability of the mobile phone can be improved.

12 Claims, 5 Drawing Sheets

POWER-CONTROL DEVICE, ELECTRONIC APPARATUS INCLUDING THE SAME, AND METHOD FOR ACTIVATING ELECTRONIC APPARATUS

CLAIM OF PRIORITY

This application claims benefit of the Japanese Patent Application No. 2007-060210 filed on Mar. 9, 2007, which is hereby incorporated in its entirety by reference.

BACKGROUND OF THE INVENTION

1. Field of the Invention

The present invention relates to a power-control device capable of automatically supplying power when a user simply holds the power-control device with a hand of the user, an electronic apparatus including the power-control device, and a method for activating the electronic apparatus. More particularly, the present invention relates to a power-control device in which a capacitance-type touch sensor is used, an electronic apparatus including the power-control device, and a method for activating the electronic apparatus.

2. Description of the Related Art

Japanese Unexamined Patent Application Publication No. 2004-312477 discloses a camera apparatus in which a power-control device, which is capable of automatically supplying power at a timing based on an intention of a user, is mounted.

This camera apparatus includes a directional sensor, which detects the vertical and horizontal directions of a body of the camera apparatus, a light sensor, which detects ambient brightness, a vibration sensor, which detects vibration, or a touch sensor, which detects that a user touches a specified portion of the body of the camera apparatus. When the output of each of the sensors is changed on the basis of a corresponding detection, power of the camera apparatus is automatically supplied.

However, it is difficult to ensure a stable activation in a configuration with only one directional sensor. More specifically, in a configuration with the touch sensor, in order to reliably activate the camera apparatus, the user must touch the specified portion of the camera apparatus, in which the touch sensor is mounted, or must continue touching the specified portion until power is supplied or the activation is confirmed. Accordingly, unfortunately, the operability of the camera apparatus is poor.

For this reason, in Japanese Unexamined Patent Application Publication No. 2004-312477, for example, a configuration with a combination of the directional sensor and the light sensor (in the third embodiment), a configuration with a combination of the directional sensor and the vibration sensor (in the forth embodiment), a configuration with a combination of the direction sensor and the touch sensor (in the fifth embodiment), and a configuration with a combination of the light sensor and the touch sensor (in the six embodiment) are described. In other words, the stabilization of the activation is designed by using a plurality of sensors including two or more types of sensors.

However, in the above-described configurations, each of which uses a combination of a plurality of sensors including two or more types of sensors, a complicated control circuit for the sensors is necessary, and an additional software program used to control the sensors is also necessary. Accordingly, the manufacturing cost is markedly increased.

SUMMARY

A power-control device according to an aspect of the present disclosure includes a sensor unit and a detection unit. The sensor unit includes a sensor electrode, a conductive substrate that has an area larger than that of the sensor electrode, and a case formed of an insulating material. The conductive substrate is provided inside the case. The sensor electrode is electrically connected to the conductive substrate, and the sensor unit generates capacitance between a human body and the surface of the case when the human body touches the surface of the case. The detection unit detects the capacitance and outputs an activation signal used to supply power.

The area of the sensor electrode can be substantially extended to that of the conductive substrate. The power-control device has a configuration in which the human body can touch only the case, which is formed of an insulating material, and in which a direct touch of the human body on the conductive substrate or the sensor electrode is avoided. With this configuration, the occurrence of electrostatic damage or malfunctions due to the adherence of moisture can be prevented.

Additionally, a requirement in which a user must touch a specified portion facing the sensor electrode can be removed. Furthermore, the user does not need to keep touching the specified portion until power is supplied or the activation is confirmed. As a result, the operability can be improved.

A power-control device according to another aspect includes a sensor unit and a detection unit. The sensor unit includes an insulating substrate, a sensor electrode provided on one of the two surfaces of the insulating substrate, and a case formed of a conductive metal material. The sensor unit is fixed in a state where the other surface of the insulating substrate is adhered to the inner surface of the case, and generates capacitance between a human body and the surface of the case when the human body touches the surface of the case. The detection unit detects the capacitance and outputs an activation signal used to supply power.

In the aspect of the present invention, more specifically, a rigid substrate, on which the sensor electrode is formed as a pattern, can be used, thereby reducing the manufacturing cost.

A power-control device according to another aspect includes a sensor unit and a detection unit. The sensor unit includes an insulating substrate, a sensor electrode provided on one surface of the insulating substrate, a case formed of a conductive metal material, and an insulating sheet provided on the inner surface of the case. The insulating substrate is provided inside the case in a state where the sensor electrode is adhered to the insulating sheet. The sensor unit generates capacitance between a human body and the surface of the case when the human body touches the surface of the case. The detection unit detects the capacitance and outputs an activation signal used to supply power.

In the aspect of the present invention, more specifically, even when the thickness of the insulating substrate is large and it is difficult to ensure the capacitance, the rigid substrate, on which the sensor electrode is formed as a pattern, can be used as it is.

A method for activating an electronic apparatus having a plurality of sensor electrodes that are provided on a plurality of surfaces of a case and that are used to detect capacitances provided between a human body and the plurality surfaces of the case includes the followings: determining whether or not each of sensor units is turned on; determining whether or not the number of sensor units that are turned on is more than one; determining whether or not the amount of change in each of the capacitances detected in a corresponding one of the sensor units is equal to or higher than a predetermined threshold; determining whether or not the amount of change in each of the capacitances falls in a predetermined range.

In the aspect of the present invention, particularly in a case where the number of sensor units included in the electronic apparatus is more than one, when the user is holding the electronic apparatus with a hand of the user, whether or not the user is holding the electronic apparatus can be determined. By using the determination, the operation mode of the electronic apparatus can be reliably set from the low power consumption mode to the normal power mode.

In the aspects of the present invention, power can be automatically supplied when the user simply holds the electronic apparatus.

Additionally, in the aspects of the present invention, when the user touches any portion of the case, which is not limited to a specified portion on the case, power can be automatically supplied. Additionally, since the user does not need to keep touching the specified portion until the supply of power is confirmed, the operability is improved.

Furthermore, in the aspects of the present invention, when a combination of a plurality of sensors is used in order to improve the detection accuracy, a complicated control circuit for the sensors or an additional software program used to control the sensors is not necessary. Accordingly, the manufacturing cost is reduced.

DESCRIPTION OF THE EMBODIMENTS

Figure 1:
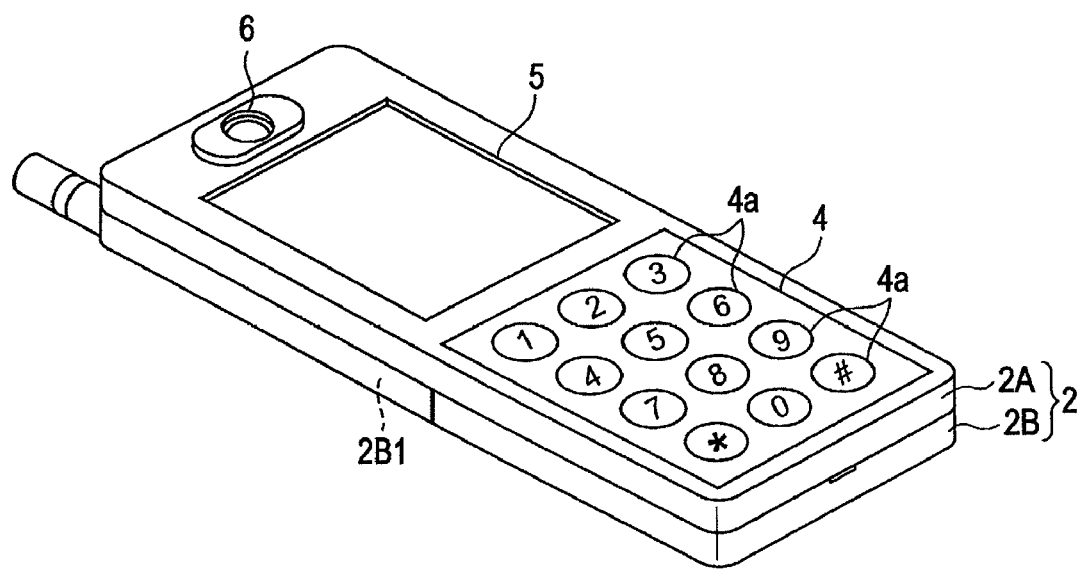
FIG. 1 is an external perspective view of a mobile phone (an electronic apparatus) that is an example in which a power-control device according to an embodiment is used.
Figure 2:
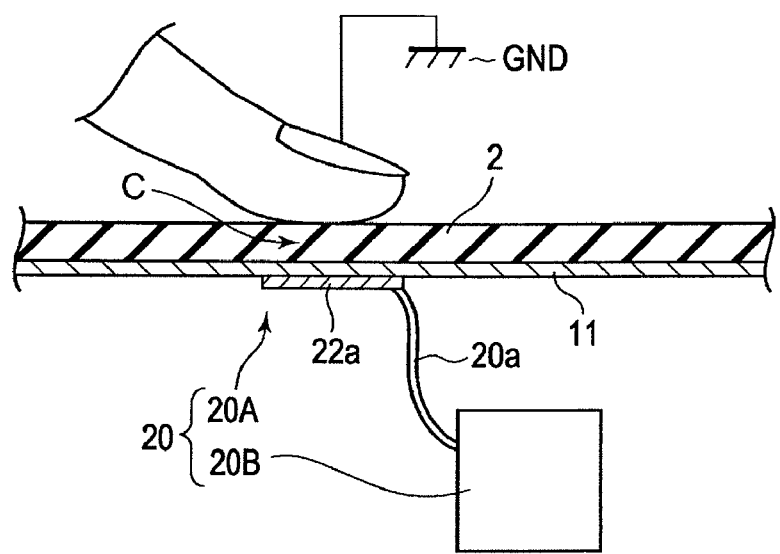
FIG. 2 is a sectional view of an electronic apparatus including a power-control device according to a first embodiment.
Figure 3:
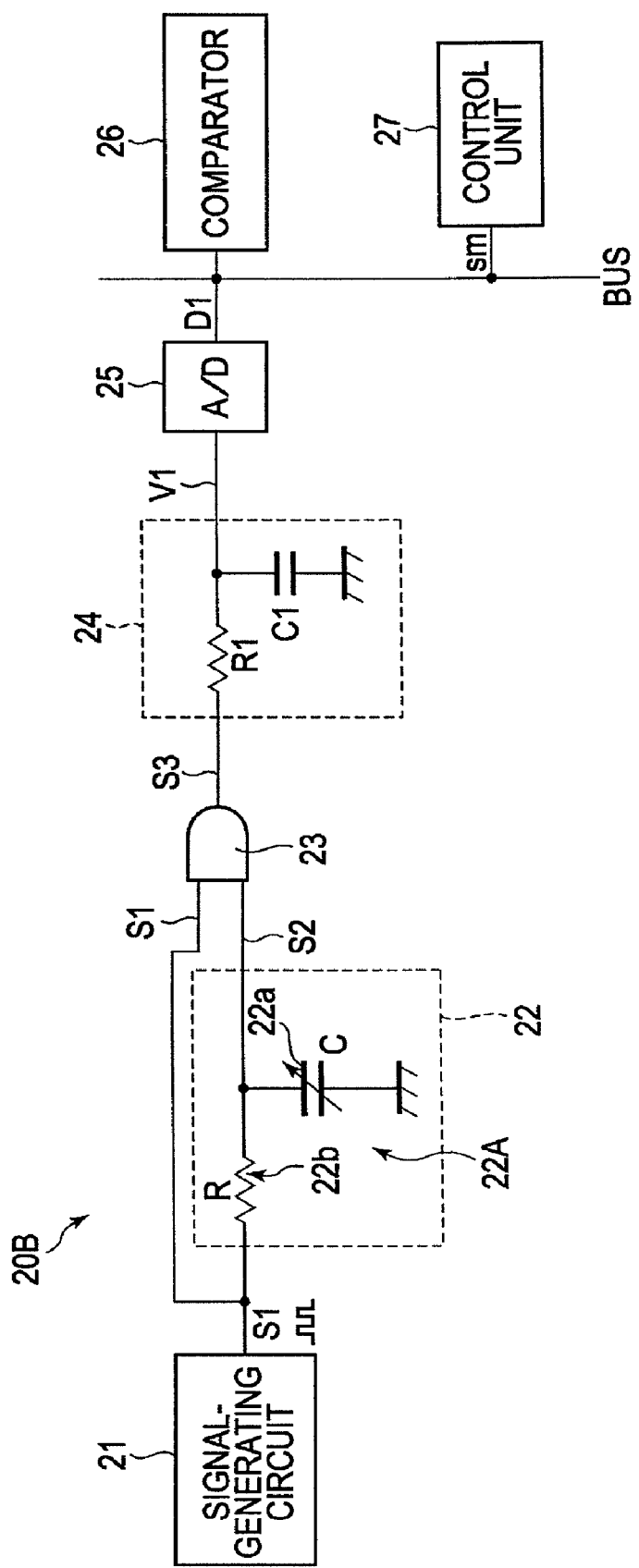
FIG. 3 is a circuit configuration of a detection unit of the power-control device.
Figure 4:
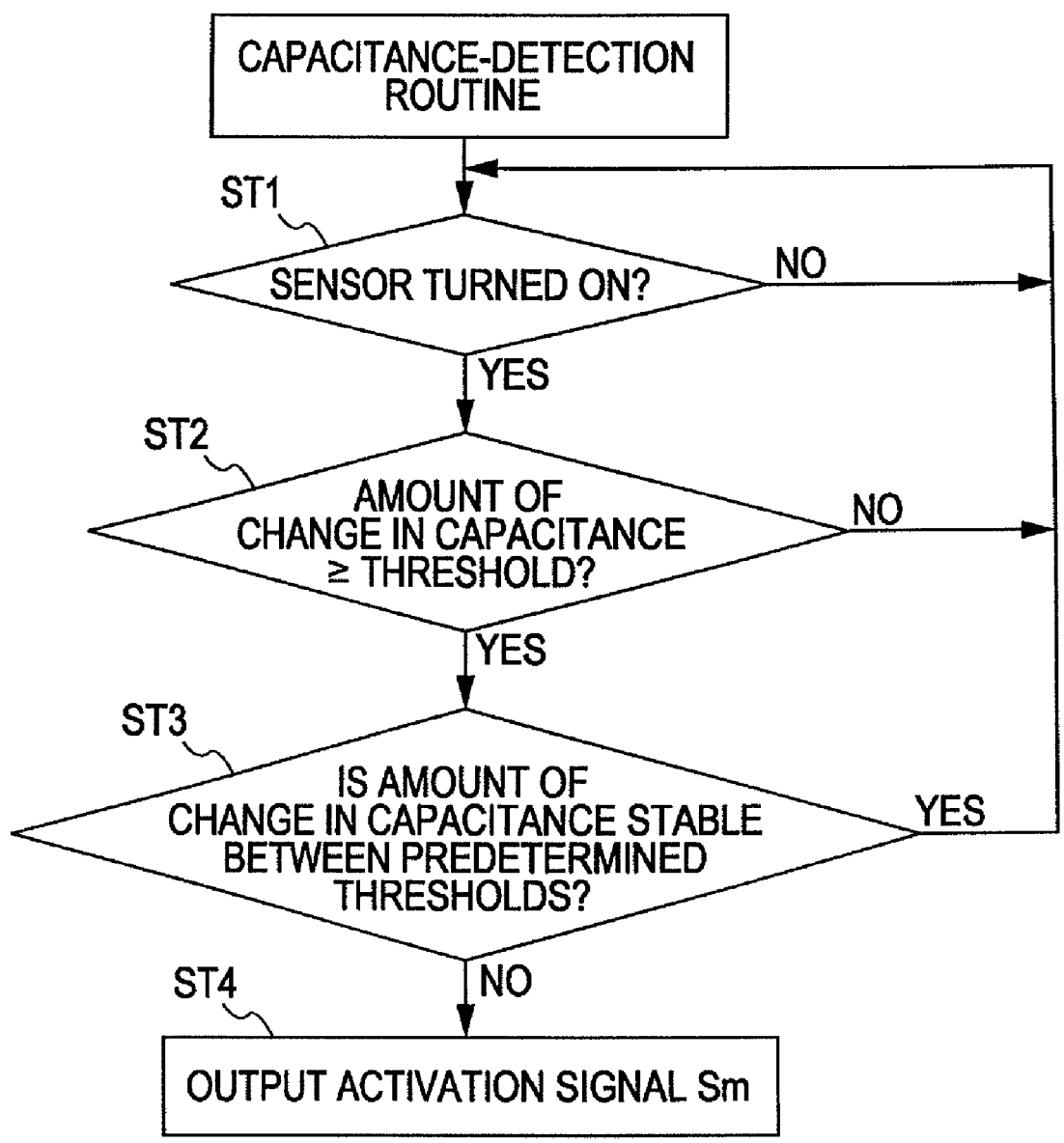
FIG. 4 is a flowchart of a method for activating the electronic apparatus in which the power-control device having one sensor unit is used.

FIG. 1 is an external perspective view of a mobile phone (an electronic apparatus) that is an example in which a power-control device according to an embodiment is used. FIG. 2 is a sectional view of an electronic apparatus including a power-control device according to a first embodiment. FIG. 3 is a circuit configuration of a detection unit of the power-control device. FIG. 4 is a flowchart of a method for activating the electronic apparatus in which the power-control device having one sensor unit is used.

The electronic apparatus shown in FIG. 1 is a non-folding mobile phone 1. This mobile phone (the electronic apparatus) 1 includes a case 2 having an upper case 2A and a lower case 2B. On the surface of the upper case 2A, for example, an operation unit 4 including a plurality of operation switches 4a, a display unit 5 on which characters or images can be displayed, a lens 6 used for an electronic camera, and so forth are provided. The back surface of the lower case 2B is an installation surface 2B1, and a cover used to accommodate a battery is provided inside the lower case 2B.

The mobile phone (the electronic apparatus) 1 of this type has a normal power mode and a low power consumption mode as operation modes. In the normal power mode, various types of functions, such as signal transmission of the phone, sending electronic mail, a function using the Internet, and photographing with the electronic camera, can be executed. In contrast, in the low power consumption mode, only a power-control device 20, which is described below, is operated, and the other functions are halted. Accordingly, in the low power consumption mode, the functions, such as signal transmission of the phone, sending electronic mail, a function using the Internet, and photographing with the electronic camera, are disabled.

As shown in FIG. 2, the mobile phone 1 according to the first embodiment includes the power-control device 20. The power-control device 20 includes a sensor unit 20A and a detection unit 20B. The sensor unit 20A and the detection unit 20B are connected to each other through a flexible cable 20a.

The sensor unit 20A includes a sensor electrode 22a with a predetermined area as a main portion. The sensor unit 20A also includes the case 2 formed of an insulating non-conductive material with a dielectric constant, such as a synthetic resin, and a conductive substrate 11 that has a plate shape and that is provided on the inner surface of the case 2. The conductive substrate 11, which is formed of, for example, gold, silver, copper or an alloy of gold, silver, and copper, has an area larger than that of the sensor electrode 22a, and is provided on the inner surface of the case 2.

The sensor electrode 22a is electrically connected to the conductive substrate 11. For this reason, the conductive substrate 11 has the same function as that of the sensor electrode 22a. In other words, the sensor electrode 22a serves as one of two electrodes of a parallel plate capacitor, and the conductive substrate 11 has a function of substantially extending the area of the sensor electrode 22a.

When a part of a human body, such as a finger or a hand of a user, is placed at a position on the surface of the case 2 where the part of a human body faces the sensor electrode 22a, capacitance C is provided between the conductive substrate 11, which is connected to the sensor electrode 22a, and the part of a human body. In other words, since the finger, the hand of a user, or the like, which is disposed on the external surface of the case 2 so as to face the sensor electrode 22a, serves as the other electrode of the parallel plate capacitor, the capacitor C is provided between the sensor electrode 22a and the part of a human body. That is, by using the conductive substrate 11 connected to the sensor electrode 22a, a capacitance-type touch sensor is provided.

The detection unit 20B includes the following elements: a signal-generating circuit 21 that outputs a detection signal S1, which has a pulse shape and a predetermined frequency, at fixed periods; a delay circuit 22 which has the capacitance C, which is provided in the sensor electrode 22a, and a resistor 22b with resistance R and to which the detection signal S1 is input; an AND circuit 23 to which the detection signal S1 and a delay signal S2, which is output from the delay circuit 22, are input; an integration circuit (a smoothing circuit) 24 that converts the capacitance C, which is provided in the sensor unit 20A, into a voltage V1 with direct current by integrating the output of the AND circuit 23 and that outputs the voltage V1; an A/D converter 25 that converts the voltage V1 into digital data D1; and a comparator 26. The A/D converter 25 and the comparator 26 are connected through an internal bus BUS to a control unit 27.

The comparator 26 compares the digital data D1 with a predetermined threshold, which is set in advance, and has, for example, the following functions: When the digital data D1 is lower than the threshold, the comparator 26 outputs a low level signal to the control unit 27; and When the digital data D1 is equal to or higher than the threshold, the comparator 26 outputs a high level signal (an activation signal) to the control unit 27.

Functions of the mobile phone 1 according to the first embodiment will be described.

In an initial state, the operation mode of the mobile phone 1 is set to the low power consumption mode. In this low power consumption mode, the mobile phone 1 is set so as to consume only the minimum power that is necessary to activate the mobile phone 1. In this state, when the user touches the surface of the case 2, for example, by holding the mobile phone 1, the capacitance C is provided in the sensor unit 20A on the basis of an area obtained by a finger or a hand of the user and the conductive substrate 11 facing each other.

As shown in FIG. 4, since the power-control device 20 is operated in the low power consumption mode, the control unit 27 monitors whether the sensor unit 20A is turned on or off (step 1, hereinafter, referred to as "step ST1"). In this step, when it is determined that the sensor unit 20A is turned on (Yes in step ST1), the flow proceeds to step ST2. In contrast, when the sensor unit 20A is turned off (No in step ST1), the flow returns to step ST1 and the control unit 27 continues monitoring the operation state of the sensor unit 20A in the first step. Regarding the determination whether the sensor unit 20A is turned on or off, for example, whether the predetermined detection signal S1 is output or not by driving the signal-generating circuit 21 can be used as a reference for the determination. Alternatively, whether an output signal S3 of the AND circuit 23, the voltage V1 of the integration circuit 24, or the digital data D1 of the A/D converter 25 is output or not can be used as a reference for the determination.

The delay signal S2, which is the output of the delay circuit 22, is delayed on the basis of a time constant obtained from the capacitance C of the sensor electrode 22a and the resistance R of the resistor 22b. In other words, the rising edge of the waveform of the delay signal S2 is distorted. As a result, the duty of the output signal S3 of the AND circuit 23 is changed on the basis of the amount of the delay of the delay signal S2, i.e., on the basis of the amount of the capacitance C. Thus, the voltage V1, which is the output of the integration circuit 24, is changed on the basis of the amount of the capacitance C.

Next, the comparator 26 compares the digital data D1, which is converted from the voltage V1, with the predetermined threshold represented as digital data, which is set in advance, and determines whether or not the digital data D1 is equal to or higher than the predetermined threshold (step ST2). When the digital data D1 is equal to or higher than the predetermined threshold, the flow proceeds to step ST3 described below. In contrast, when the digital data D1 is lower than the predetermined threshold (No in step ST2), it is determined that the mobile phone 1 itself is not being appropriately held or touched by the user although the amount of the capacitance C is changed. Accordingly, the flow returns to step ST1.

In step ST3, the comparator 26 determines whether or not the amount of change in the capacitance C is stable between predetermined thresholds. In other words, the comparator 26 determines whether or not the digital data D1 falls in a predetermined range (between a lower value and an upper value). When the comparator 26 determines that the amount of change in the capacitance C does not fall in a predetermined range and is in an unstable state (No in step ST3), it is determined that the mobile phone 1 itself is being held by the user. As a result, the comparator 26 outputs, for example, the activation signal Sm having a high level to the control unit 27 (step ST4).

When the control unit 27 receives the activation signal Sm, the control unit 27 sets the operation mode of the mobile phone 1 to the normal power mode in which the mobile phone 1 accepts inputs. Accordingly, normal power is supplied to various circuits provided in the mobile phone 1, whereby the functions, such as signal transmission of the phone, sending electronic mail, a function using the Internet, and photographing with the electronic camera, are enabled.

Conversely, when the comparator 26 determines that the amount of change in capacitance C falls in a predetermined range and is in a stable state (Yes in step ST3), it is determined that the mobile phone 1 is placed on a metal stand or the like. In this case, the comparator 26 does not output the activation signal Sm (the low level of the activation signal Sm is maintained), and the flow returns to step ST1. In other words, even when the mobile phone 1 is placed on a metal stand, the capacitance C is provided between the conductive substrate 11 and the metal stand. However, the capacitance C provided in this case is different from that provided in the case where it is determined that the mobile phone 1 is being touched by a part of a human body, and becomes a stable value because an area obtained by the conductive substrate 11 and the metal stand facing each other is constantly maintained. Accordingly, by detecting the amount of change in the capacitance C, it can be determined whether the user touches the mobile phone 1 or the mobile phone 1 is placed on the metal stand.

Additionally, it is preferable that a recess (not shown in FIG. 2), which is a portion recessed in the direction from the surface of the case 2 to the inside of the case 2, be formed in the surface (more specifically, the installation surface) of the case 2 having the sensor electrode 22a. Even in a case where the mobile phone (the electronic apparatus) 1 has the recess formed in only a part of the surface of the case 2, when the user is holding the mobile phone 1 with a hand of the user, a finger of the hand of the user can be easily placed in the recess. In such a case, because the space between the finger of the user, which is placed in the recess, and the sensor electrode 22a, which is provided on the back surface of the recess, can be made small, the value of the capacitance C generally can be made large. In contrast, when the mobile phone (the electronic apparatus) 1 is simply placed on a metal stand, an air gap due to the recess is provided between the sensor electrode 22a and the metal stand. For this reason, the value of the capacitance C generally can be made small. In other words, the capacitance C in the case where the user is holding the mobile phone 1 with a hand of the user is larger than that in the case where the mobile phone 1 is simply placed on a metal stand. Thus, whether the mobile phone 1 is in a state where the user is holding the mobile phone (the electronic apparatus) 1 with a hand of the user or in a state where the mobile phone 1 is simply placed on a metal stand can be easily and appropriately determined.

When it is determined that the user is holding the mobile phone 1 with a hand of the user, the comparator 26 outputs the activation signal Sm. When it is determined that the mobile phone 1 is simply placed on a metal stand, the comparator 26 does not output the activation signal Sm. By utilizing the activation signal Sm, the operation mode of the mobile phone 1 can be set to the low power consumption mode or the normal power mode.

As described above, according to the first embodiment, immediately after appropriately determining that the state exists in which the user is holding the mobile phone 1 with a hand of the user, the comparator 26 can generates the activation signal Sm. In other words, immediately after the user starts holding the mobile phone 1 with a hand of the user, the mode of the mobile phone 1 is changed from the low power consumption mode to the normal power mode. As a result, the user can use application functions of the mobile phone 1 without delay. For example, the user can use the electronic camera mounted in the mobile phone 1 immediately after the user starts holding the mobile phone 1 with a hand of the user. Consequently, the frequency of missing shutter release opportunities can be decreased.

Next, a second embodiment will be described.

Figure 5:
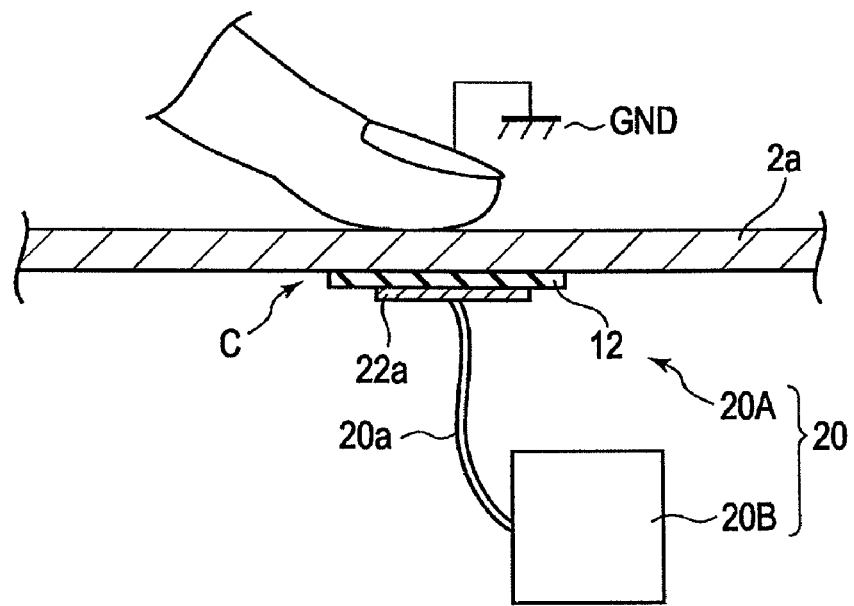
FIG. 5 is a sectional view of an electronic apparatus including a power-control device according to a second embodiment.
Figure 6:
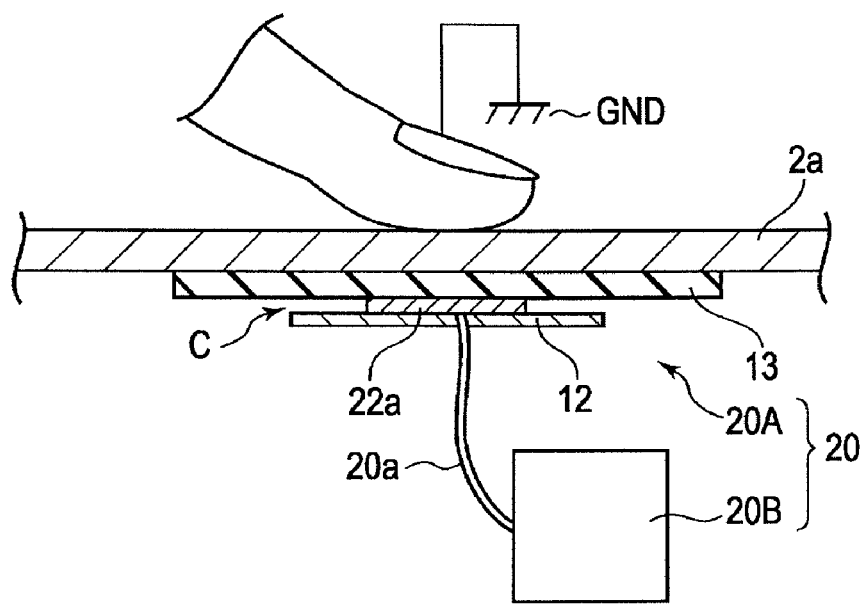
FIG. 6 is a sectional view of an electronic apparatus including a power-control device according to a modification of the second embodiment.
Figure 7:
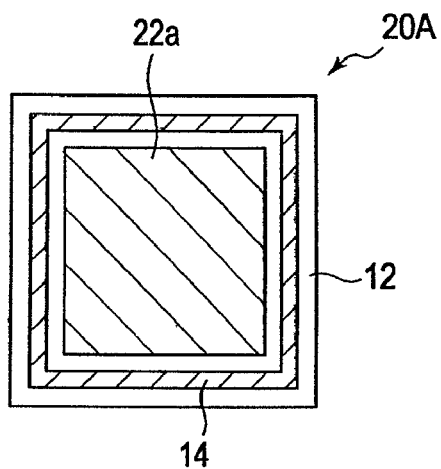
FIG. 7 is a plan view showing a preferable state of a sensor electrode.

FIG. 5 is a sectional view of an electronic apparatus including a power-control device according to a second embodiment. FIG. 6 is a sectional view of an electronic apparatus including a power-control device according to a modification of the second embodiment. FIG. 7 is a plan view showing a preferable state of the sensor electrode.

As shown in FIG. 5, in the mobile phone (the electronic apparatus) 1 according to the second embodiment, a metal case 2a having a conductive property is used as the case 2 that is exposed to the outside. In contrast, the case 2 of the mobile phone 1 according to the first embodiment is formed of a non-conductive material. In this aspect, the configuration of the mobile phone 1 according to the second embodiment is different from that of the mobile phone 1 according to the first embodiment.

Suppose that the sensor electrode 22a of the sensor unit 20A is directly mounted on the back surface of the metal case 2a. When noise occurs, a high voltage due to the noise directly influences the detection unit 20B. This may cause a breakdown. For this reason, in the second embodiment, an insulating substrate 12 is provided on the inner surface of the metal case 2a. As the insulating substrate 12, for example, a rigid substrate that is formed of glass epoxy or the like, or an insulating sheet with flexibility that is formed of polyethylene terephthalate (PET) or the like can be used. The sensor electrode 22a is formed as a pattern on the surface of the insulating substrate 12 (the underside of the insulating substrate 12 in FIG. 5). The sensor electrode 22a is fixed in a state where the insulated substrate 12 is adhered to the inner surface of the metal case 2a.

As described above, in the second embodiment shown in FIG. 5, since the insulating substrate 12, on the surface of which the sensor electrode 22a is formed as a pattern, can be used as it is, the manufacturing cost can be reduced. Except for the insulating substrate 12, the configuration of the power-control device 20 according to the second embodiment is the same as that of the power-control device 20 according to the first embodiment described above. Additionally, the operations of the power-control device 20 according to the second embodiment are executed in accordance with the flowchart of the power-control device 20 according to the first embodiment described above.

When the insulating substrate 12 is a substrate whose thickness is large, such as a rigid substrate, the capacitance C can be easily made small. In such a case, as shown in FIG. 6, a thin insulating sheet 13, which is formed of, for example, PET or the like, may be mounted on the inner surface of the metal case 2a. Then, on the insulating sheet 13, the insulating substrate 12 can be fixed in a state where the sensor electrode 22a is adhered to the insulating sheet 13. Because, with this configuration, the space between sensor electrode 22a and the metal case 2a can be made small, the capacitance C provided therebetween can be made large.

In the second embodiment shown in FIG. 5 and the modification of the second embodiment shown in FIG. 6, because the metal case 2a is exposed to the outside, the metal case 2a is in an unstable state where the metal case 2a is not electrically connected to a ground GND. In such a state, when a part of a human body, such as a finger or a hand of the user, touches the mobile phone 1, the metal case 2a is grounded through the human body of the user to the ground GND. As a result, the capacitance C is provided between the sensor electrode 22a and the metal case 2a. The capacitance C provided in such a case is detected by the power-control device 20. Then, the activation signal Sm is output on the basis of whether or not the voltage V1 corresponding to the capacitance C, i.e., the digital data D1, exceeds the predetermined threshold, as in the above-described case.

Accordingly, in the second embodiment or the modification thereof, as in the case of the first embodiment, the mobile phone 1 can be immediately activated, i.e., the operation mode of the mobile phone 1 can be set to the normal power mode, by using the activation signal Sm, which is generated in the case where the user is holding the mobile phone 1 with a hand of the user, as a trigger.

In the second embodiment and the modification thereof, which are described above, the sensor electrode 22a serves as one of two electrodes of a parallel plate capacitor, and the metal case 2a, which is configured as the outer portion of the mobile phone (the electronic apparatus) 1, serves as the other electrode of the parallel plate capacitor. When the user does not touch the mobile phone (the electronic apparatus) 1, the other electrode (the metal case 2a) is not grounded, whereby the capacitance C is not provided. Only after the user starts touching the mobile phone 1, is the other electrode (the metal case 2a) grounded to the ground GND, whereby the capacitance C is provided.

The metal case 2a, which covers all of the surfaces of the mobile phone (the electronic apparatus) 1, can serve as a shielding case used for magnetic shielding. For this reason, the metal case 2a blocks the entry of extraneous noise into the inside of the mobile phone (the electronic apparatus) 1, thereby preventing malfunctions of the mobile phone (the electronic apparatus) 1. As a result, the detection accuracy can be improved.

In the second embodiment and the modification thereof, which are described above, when the mobile phone (the electronic apparatus) 1 itself is simply placed on a metal stand, the metal case 2a is grounded through the metal stand to the ground GND. Accordingly, when the mobile phone (the electronic apparatus) 1 is simply placed on the metal stand, the capacitance C is provided in the sensor unit 20A. As in the case of the first embodiment, the comparator 26 determines whether or not the amount of change in the capacitance C is stable between the predetermined thresholds. When the comparator 26 determines that the amount of change in the capacitance C is unstable, it is preferable that the comparator 26 output the activation signal Sm to the control unit 27 (step ST4). When the comparator 26 determines that the amount of change in the capacitance C is stable, it is also preferable that the comparator 26 not output the activation signal Sm (step ST5).

When the control unit 27 receives the activation signal Sm, the control unit 27 sets the operation mode of the mobile phone 1 to the normal power mode. Accordingly, as in the case of the second embodiment, the operation mode can be changed from the low power consumption mode to the normal power mode when the user simply holds the mobile phone 1 with a hand of the user. Thus, the functions, such as signal transmission of the phone, sending electronic mail, a function using the Internet, and photographing with the electronic camera, are enabled immediately after the user starts holding the mobile phone 1 with a hand of the user.

In the first embodiment, the second embodiment, and the modification of the second embodiment, which are described above, the user can touch any portion of the mobile phone (the electronic apparatus) 1. Accordingly, the requirement in the related art, in which the user must touch a specified portion, can be removed. Additionally, the user does not need to keep touching the specified portion over more than a given period of time. Thus, the load of the user can be reduced. As a result, the operability of the mobile phone (the electronic apparatus) 1 can be improved.

In each of the power-control devices shown in FIGS. 5 and 6, the sensor electrode 22a is formed as a pattern on the surface of the insulating substrate 12. In this case, as shown in FIG. 7, a configuration in which a shielding electrode 14 is provided so as to surround the sensor electrode 22a at a predetermined distance from the sensor electrode 22a on the insulating substrate 12 is preferable.

As described above, in the case where the shielding electrode 14 is provided around the sensor electrode 22a, when noise occurs, the shielding electrode 14 protects the sensor electrode 22a, which is located inside the shielding electrode 14, whereby the sensor electrode 22a becomes resistant to the influence of the noise. More specifically, the shielding electrode 14 can prevent, for example, breakdown of electronic components, which are provided on the side of the detection unit 20B, that is caused by a high voltage due to electrostatic noise, which is superimposed on the sensor electrode 22a.

Next, a configuration in which a plurality of the above-described touch sensors is used will be described.

Figure 8:
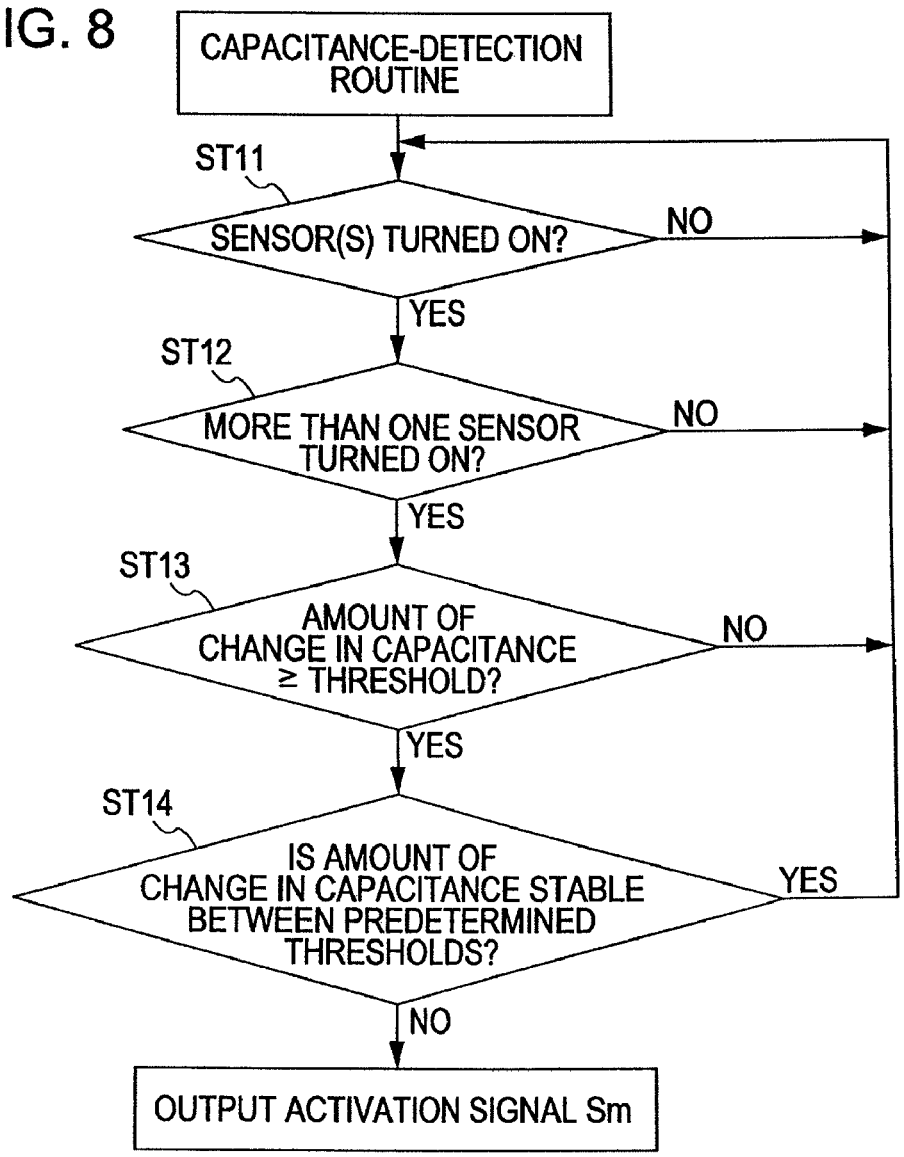
FIG. 8 is a flowchart of a method for activating an electronic apparatus including the power-control device in which a plurality of sensor units is used.

FIG. 8 is a flowchart of a method for activating an electronic apparatus including the power-control device in which a plurality of sensor units is used.

In a case of a compact electronic apparatus, such as the mobile phone 1, the user can hold the mobile phone 1 with only one hand. In this case, the hand of the user can touch at least two surfaces of the mobile phone 1 including not only the installation surface of the mobile phone 1 but also the left and right sides of the mobile phone 1, and the surface (the operation surface) of the mobile phone 1, on which the operation unit 4, the display unit 5, and so forth are provided. In an embodiment described below, a configuration is described in which the sensor electrodes 22a are individually provided not only on the installation surface, as described above, but also on portions of the mobile phone 1, such as the left and right sides of the mobile phone 1 and the operation surface. As each of the sensor electrodes 22a, any of the sensor electrode 22a according to the first embodiment, the sensor electrode 22a according to the second embodiment, and the sensor electrode 22a according to the modification of the second embodiment can be used. When the sensor electrodes 22a according to the first embodiment are used, the conductive substrate 11 is provided for each surface of the case 2, and the conductive substrates 11 are insulated from each other. Additionally, each of the sensor electrodes 22a is individually provided for a corresponding one of the conductive substrates 11. When the sensor electrodes 22a according to the second embodiment or the sensor electrodes 22a according to the modification of the second embodiment are used, a configuration may be used in which metal plates, each of which is configured as a corresponding surface of the metal case 2a, are insulated from each other, and each of the sensor electrodes 22a is individually provided on a corresponding one of the metal plates. Alternatively, a configuration may be used in which the surfaces of the metal case 2a are formed as one unit using a single metal plate and each of the sensor electrodes 22a is provided on a corresponding one of the surfaces of the metal case 2a.

As shown in FIG. 8, the control unit 27 monitors the operation states of the sensor units 20A, each of which is provided on a corresponding one of the surfaces (step 11, hereinafter, referred to as "step ST11"). In this step, the control unit 27 determines whether or not each of the sensor units 20A is turned on in the same manner described above. When it is determined that at least one of the sensor units 20A is turned on (Yes in step ST11), the flow proceeds to step ST12. In contrast, when all of the sensor units 20A are turned off (No in step ST11), the flow returns to step ST11 and the control unit 27 continues monitoring the operation states of the sensor units 20A.

Next, the control unit 27 determines whether or not the number of sensor units 20A that are turned on is more than one. When the number of sensor units 20A that are turned on is more than one (Yes in step ST12), the flow proceeds to step ST13. In contrast, when the number of sensor units 20A that are tuned on is one (No in step ST12), i.e., when only one of the sensor units 20A that are provided on the surfaces of the mobile phone 1 is turned on, it is indicated that the mobile phone 1 is placed on a metal stand. In this case, the flow returns to step ST11 and the control unit 27 continues monitoring the operation states of the sensor units 20A.

In step ST13, the comparator 26 determines whether or not the amount of change in the detected capacitance C is equal to or higher than a predetermined threshold. When the amount of change in the capacitance C is equal to or higher than the predetermined threshold (Yes in step ST13), the flow proceeds to step ST14. In contrast, when the amount of change in capacitance C is lower than the predetermined threshold (No in step ST13), a change of the capacitance C is observed but the amount of change in capacitance C is lower than a fixed value. In this case, it is determined that the mobile phone 1 is not being held by the user. Accordingly, the flow returns to step ST11, and the control unit 27 continues monitoring the operation states of the sensor units 20A.

In step ST14, the comparator 26 determines whether or not the amount of change in the capacitance C is stable in a predetermined range. When the comparator 26 determines that the amount of change in the capacitance C is stable (Yes in step ST14), it is determined that the mobile phone 1 is placed on a metal stand. When the comparator 26 determines that the amount of change in the capacitance C is not stable (No in step ST14), it is determined that the mobile phone 1 is being held with a hand of the user.

As in the case of each of the above-described embodiments, when it is determined that the user is holding the mobile phone 1 with a hand of the user, the comparator 26 outputs the activation signal Sm. When it is determined that the mobile phone 1 is simply placed on a metal stand, the comparator 26 does not output the activation signal Sm. By utilizing the activation signal Sm, the operation mode of the mobile phone 1 can be set to the low power consumption mode or the normal power mode.

As described above, also in the configuration in which the plurality of the sensor units 20A is used, when the user holds the mobile phone 1 with a hand of the user, the operation mode of the mobile phone 1 can be changed from the low power consumption mode to the normal power mode. As a result, the user can use the application functions of the mobile phone 1 immediately after the activation.

Since the operation states of the plurality of the sensor units 20A are monitored, whether the mobile phone 1 is being held by the user or not can be stepwisely determined. Accordingly, the probability of making mistakes (error detections) for this determination is lower, compared with the case where the determination is made using one sensor unit 20A. Thus, the stable activation of the mobile phone (the electronic apparatus) 1 can be ensured.

Furthermore, the power-control device can be configured only using capacitance-type touch sensors, and other different types of sensors are not necessary. In other words, since the power-control device is configured to use a plurality of touch sensors that are the same type of (the capacitance-type) touch sensors in order to improve the detection accuracy, the complicity of the control circuit for the touch sensors is avoided. Additionally, the operations related to the touch sensors can be processed by the same type of software programs, and a plurality of additional software programs whose type is different from one another are not necessary. Accordingly, the decrease in the processing speed can be prevented and the increase in the manufacturing cost can be suppressed.

In addition, in the embodiments of the present invention, since the sensor electrodes 22a, each of which is included in a corresponding one of the sensor units 20A, are configured to be disposed on the inner surfaces of the case 2, the appearance of the case 2 is not influenced by the disposition of the sensor electrodes 22a. In other words, since the mobile phone 1 includes the power-control device, the design of the appearance of the mobile phone 1 does not need to be changed.

Although the mobile phone 1 with the camera has been described in the foregoing embodiments as an example of an electronic apparatus in which the power-control device is used, the present invention is not limited thereto. The power control device according to any of the embodiments of the present invention can be used in other portable electronic apparatuses including a discrete electronic camera, a video camera, a personal digital assistant (PDA), a portable radio, an electronic dictionary, and a laptop computer.

What is claimed is:

1. A power-control device comprising:
a sensor unit including a sensor electrode, a conductive substrate that has an area larger than that of the sensor electrode, and a case formed of an insulating material, the conductive substrate being provided inside the case, the sensor electrode being electrically connected to the conductive substrate, the sensor unit that generates capacitance between a human body and a surface of the case when the human body touches the surface of the case;
a detection unit that detects the capacitance and outputs an activation signal used to supply power; and
wherein the detection unit includes a signal generating circuit that outputs a detection signal having a predetermined frequency, a delay circuit that generates a delay signal from the detection signal on the basis of a time constant, an AND circuit to which the detection signal and the delay signal are input, an integration circuit that integrates an output of the AND circuit, an analog-to-digital converter that converts an output of the integration circuit into a digital signal, and a comparator that compares an output of the analog-to-digital converter with a predetermined threshold, and outputs the predetermined activation signal on the basis of a result of the comparison.

2. A power-control device comprising:
a sensor unit including an insulating substrate, a sensor electrode provided on one of two surfaces of the insulating substrate, and a case formed of a conductive metal material, the sensor unit being fixed in a state where the other surface of the insulating substrate is adhered to an inner surface of the case, the sensor unit generating capacitance between a human body and a surface of the case when the human body touches the surface of the case; and
a detection unit that detects the capacitance and outputs an activation signal used to supply power;
wherein the detection unit includes a signal generating circuit that outputs a detection signal having a predetermined frequency, a delay circuit that generates a delay signal from the detection signal on the basis of a time constant, an AND circuit to which the detection signal and the delay signal are input, an integration circuit that integrates an output of the AND circuit, an analog-to-digital converter that converts an output of the integration circuit into a digital signal, and a comparator that compares an output of the analog-to-digital converter with a predetermined threshold, and outputs the predetermined activation signal on the basis of a result of the comparison.

3. A power-control device comprising:
a sensor unit including an insulating substrate, a sensor electrode provided on one surface of the insulating substrate, a case formed of a conductive metal material, and an insulating sheet provided on an inner surface of the case, the insulating substrate being provided inside the case in a state where the sensor electrode is adhered to the insulating sheet, the sensor unit generating capacitance between a human body and a surface of the case when the human body touches the surface of the case; and
a detection unit that detects the capacitance and outputs an activation signal used to supply power; and
wherein the detection unit includes a signal generating circuit that outputs a detection signal having a predetermined frequency, a delay circuit that generates a delay signal from the detection signal on the basis of a time constant, an AND circuit to which the detection signal and the delay signal are input, an integration circuit that integrates an output of the AND circuit, an analog-to-digital converter that converts an output of the integration circuit into a digital signal, and a comparator that compares an output of the analog-to-digital converter with a predetermined threshold, and outputs the predetermined activation signal on the basis of a result of the comparison.

4. The power-control device according to claim 1, wherein the conductive substrate includes at least two conductive substrates, each of the conductive substrates being provided on a corresponding surface of the case in a state where the conductive substrates are insulated from each other, and the sensor unit includes a plurality of sensors, the plurality of sensor units being configured on at least two surfaces of the case.

5. The power-control device according to claim 2 further comprising a shielding electrode provided so as to surround the sensor electrode at the periphery of the sensor electrode on the insulating substrate.

6. The power-control device according to claim 1, wherein the case is configured as one unit by combining an upper case with a lower case, and the sensor electrode is provided on at least one of the upper and lower cases.

7. The power-control device according to claim 1, wherein a recess is formed at a position where the recess faces the sensor electrode on at least one surface of the case including the sensor electrode so as to be recessed in a direction away from the surface of the case to an inside of the case.

8. The power-control device according to claim 1, wherein the delay circuit is configured to have a resistor with a predetermined resistance and the capacitance.

9. An electronic apparatus comprising the power-control device according to claim 1.

10. The power-control device according to claim 1, wherein the detection unit determines that the case is being touched by a part of the human body of a user in a state where the capacitance exceeds a predetermined threshold, and outputting the activation signal.

11. The power-control device according to claim 1, wherein the detection unit determines:
   if the sensor unit is turned on;
   if the amount of change in the capacitance is equal to or higher than a predetermined threshold; and
   if the detected capacitance falls in a predetermined range.

12. A method for activating an electronic apparatus including a plurality of sensor electrodes that are provided on a plurality of surfaces of a case and that are used to detect capacitances provided between a human body and the plurality of surfaces of the case, the method comprising the steps of:
   determining whether or not each of sensor units is turned on;
   determining whether or not the number of sensor units that are turned on is more than one;
   determining whether or not the amount of change in each of the capacitances detected in a corresponding one of the sensor units is equal to or higher than a predetermined threshold;
   determining whether or not the amount of change in each of the capacitances falls in a predetermined range;
   outputting, by a signal generating circuit, a detection signal having a predetermined frequency;
   generating a delay signal, by a delay circuit, from the detection signal on the basis of a time constant;
   inputting into an AND circuit, the detection signal and the delay signal;
   integrating, by an integration circuit, an output of the AND circuit
   converting, by an analog-to-digital, an output of the integration circuit into a digital signal
   comparing, by a comparator, an output of the analog-to-digital converter with a predetermined threshold; and
   outputting the predetermined activation signal on the basis of a result of the comparison.

* * * * *